(12) United States Patent
Everth et al.

(10) Patent No.: US 9,671,454 B2
(45) Date of Patent: Jun. 6, 2017

(54) METHOD FOR DETECTING A DEVICE THAT GENERATES SPURIOUS SIGNALS IN AN ELECTRICAL NETWORK, AN ELECTRICAL SYSTEM AND AN AIRCRAFT

(71) Applicant: Airbus Operations GmbH, Hamburg (DE)

(72) Inventors: Henning Everth, Hamburg (DE); Jens Schult, Stelle (DE)

(73) Assignee: Airbus Operations GmbH (DE)

( * ) Notice: Subject to any disclaimer, the term of this patent is extended or adjusted under 35 U.S.C. 154(b) by 171 days.

(21) Appl. No.: 14/034,681

(22) Filed: Sep. 24, 2013

(65) Prior Publication Data
US 2014/0084951 A1   Mar. 27, 2014

Related U.S. Application Data

(60) Provisional application No. 61/705,928, filed on Sep. 26, 2012.

(30) Foreign Application Priority Data

Sep. 26, 2012   (DE) .................... 10 2012 217 497

(51) Int. Cl.
*G01R 31/00* (2006.01)
*G01R 31/28* (2006.01)
(Continued)

(52) U.S. Cl.
CPC ..... *G01R 31/2836* (2013.01); *G01R 19/2513* (2013.01); *G01R 31/008* (2013.01);
(Continued)

(58) Field of Classification Search
CPC ......... G01R 1/00; B60L 1/00; B60L 2200/00; H02H 1/00; G06Q 10/00; G06Q 2220/00; G06Q 2230/00
See application file for complete search history.

(56) References Cited

U.S. PATENT DOCUMENTS 4,366,474 A * 12/1982 Loewenstein ................. 340/658
6,172,862 B1 * 1/2001 Jonnatti ............... H02H 1/0015
340/647

(Continued)

FOREIGN PATENT DOCUMENTS

DE   12 93 874 B    4/1969
DE   197 30 595 C1  11/1998
(Continued)

OTHER PUBLICATIONS

German Office Action Jun. 22, 2016.

*Primary Examiner* — Jermele M Hollington
*Assistant Examiner* — Temilade Rhodes-Vivour
(74) *Attorney, Agent, or Firm* — Lerner, David, Littenberg, Krumholz & Mentlik, LLP

(57) ABSTRACT

A method for detecting a device that generates spurious signals in an electrical network, to which several devices and at least one fault detection device are connected, includes the steps of monitoring the electrical network for electrical spurious signals, sequentially deactivating each device for a predetermined time T when an electrical spurious signal has been detected, and checking the electrical network for the disappearance of the respective spurious signal, and signaling as soon as the respective spurious signal has disappeared upon deactivating a respective device. This makes it possible to especially reliably detect a device in an electrical network that couples an undesired spurious signal into the network.

11 Claims, 2 Drawing Sheets

(51) Int. Cl.
*G01R 19/25* (2006.01)
*G01R 1/00* (2006.01)
*B60L 1/00* (2006.01)

(52) U.S. Cl.
CPC *B60L 1/00* (2013.01); *G01R 1/00* (2013.01); *G06Q 2230/00* (2013.04)

(56) References Cited

U.S. PATENT DOCUMENTS

| | | | | |
|---|---|---|---|---|
| 6,559,660 | B1* | 5/2003 | Staerzl | G01R 31/008 204/196.01 |
| 6,654,219 | B1* | 11/2003 | Romano | H02H 1/0015 324/500 |
| 7,366,622 | B1* | 4/2008 | Nemir | G01R 31/1272 361/2 |
| 2003/0205460 | A1* | 11/2003 | Buda | H01J 37/32935 204/192.13 |
| 2008/0021664 | A1* | 1/2008 | Krauss et al. | 702/65 |
| 2011/0043952 | A1* | 2/2011 | Haussel | H02H 3/46 361/52 |
| 2011/0163777 | A1* | 7/2011 | Yelgin | H02H 3/40 324/764.01 |
| 2011/0248721 | A1* | 10/2011 | Higgins | G01R 31/1272 324/537 |

FOREIGN PATENT DOCUMENTS

| | | |
|---|---|---|
| DE | 10 2004 033 511 A1 | 2/2006 |
| DE | 10 2007 030 745 A1 | 1/2009 |
| DE | 10 2009 054 891 A1 | 6/2011 |
| GB | 1206543 A | 9/1970 |

* cited by examiner

METHOD FOR DETECTING A DEVICE THAT GENERATES SPURIOUS SIGNALS IN AN ELECTRICAL NETWORK, AN ELECTRICAL SYSTEM AND AN AIRCRAFT

CROSS-REFERENCE TO RELATED APPLICATIONS

The present application claims the benefit of the filing date of U.S. Provisional Patent Application No. 61/705,928, filed Sep. 26, 2012, the disclosure of which is hereby incorporated herein by reference.

TECHNICAL AREA

The invention relates to a method for detecting a device that generates spurious signals in an electrical network, an electrical system as well as an aircraft with such an electrical system.

BACKGROUND OF THE INVENTION

Electrical devices and equipment in buildings or vehicles are usually supplied via an electrical network over which the electrical power is distributed. The latter is here provided by one or more power supply units and transmitted over electrical lines. Due to the combined use of electrical lines within such a network, electrical spurious signals released by individual devices via their connection to the electrical network can be detected by other devices.

Electrical consumers in vehicles and in particular in aircraft must satisfy strict electrical requirements, and can only release slight electrical disturbances in an electrical network and electromagnetic disturbances in their environment. The interpretation of an electrical spurious signal detected by an automatic fault detector integrated into a device is hampered by the necessary recognition of whether the electrical spurious signal comes from inside or outside the respective device. As a consequence, it is rather difficult to unequivocally diagnose and identify a detected error within the electrical system.

BRIEF SUMMARY OF THE INVENTION

An aspect of the invention proposes a method that enables the detection of faulty devices in an electrical network as unequivocally as possible. In particular, the method to be proposed is also intended to ensure that devices with integrated error detection do not interpret the electrical spurious signals of other devices released into the electrical network as their own error.

A method for detecting a device that generates spurious signals in an electrical network to which several devices and at least one fault detection device are connected involves the steps of acquiring an electrical spurious signal in the electrical network, sequentially influencing the power supply of at least one of the devices for a predetermined time via the electrical network, and correspondingly checking the electrical network for any change in the respective electrical spurious signal resulting from this influencing until such time as the respective spurious signal changes, and signaling at which of at least one of the devices the respective spurious signal changed.

Consequently, a core aspect of the invention lies in being able to monitor an electrical network with the help of a fault detection device, so as to at any location acquire those electrical spurious signals coupled into the electrical network that exceed a specific tolerance range and should normally not be present in the electrical network. A substantial influence is exerted by circuit feedback, which results from an arising error in an electrical component of a device connected with the electrical network. This relates in particular to devices with nonlinear current-voltage characteristics or a nonlinear operational behavior, so that circuit feedback therein caused by a defect or partial defect in one or more components directly connected with the electrical network is uncommon for the device in question and can simultaneously be clearly discerned by monitoring the network. In particular, such a behavior may arise in the case of defects in power electronics, for example comprising bipolar transistors, thyristors or the like, semiconductors in general, mechanical defects in electrical lines or other electrical errors. Essentially the following different individual or overlapping electrical spurious signals may be encountered, at least in electrical networks based on alternating voltage:

Harmonics in the current or voltage curve,
Interharmonics in the current or voltage curve,
Short, repeated or regular change in the root-mean-square value for the voltage or current, and
Formation of voltage or current asymmetries, for example resulting from a deviation in a prescribed phase difference.

For example, a defect in a diode connected directly with the network as a semiconductor in power electronics may be transferred into the electrical system as a hum arising as a harmonic, which is detected according to an aspect of the invention by the fault detection device. If a spurious signal is present, the electrical network is sequentially or iteratively analyzed to identify the device generating a spurious signal. This is done by sequentially influencing the power supply to the devices, wherein influencing the power supply to the device involves changing the supply of electrical current, along with also separating the connection to one or more phases of an alternating voltage line (hereinafter also referred to as a galvanic separation). For example, in addition to reducing the power supply via special power electronics in particular integrated into the respective device, this may also involve completely shutting down the power electronics. Also conceivable would be to increase the power supply.

While influencing the power supply in this way, it may then be determined within a respective very short time T whether the acquired electrical spurious signal changes. If the respective device is completely separated from the network, the electrical spurious signal may disappear entirely. If only the power supply is reduced, the spurious signal may also only be reduced, wherein this reduction may also be discerned by the fault detection device. Should the respective device whose power supply is being influenced not be responsible for the electrical spurious signal, the electrical spurious signal remains unchanged.

If the respective electrical network is in a modern means of transport, for example an aircraft, it may for reasons of redundancy there be connected with several power supply sources, which distribute electrical power to the devices connected with the electrical network. For example, this may involve several generators, which are each mechanically coupled with an engine shaft, and provide electrical power during flight. However, electrical power may also be supplied by a ground power supply or a generator operated by the APU during ground operations, and when preparing for flight operations after starting the main engines be switched over to one or more generators operated by a main engine. Due to the alternating voltage that is normally used, a phase adjustment may be performed during this switchover process to synchronize the supplied voltages, or the current flow may be completely interrupted for a brief time so as to prevent any damage to the generators by phase-shifted, non-synchronous voltages. During this switchover process over a very short time, the electrical network and electrical devices connected thereto are not actively supplied with electrical power, wherein this time measures distinctly under one second, for example within a range of a few or several 100 ms. As a consequence, the electrical devices connected to the electrical network must satisfy guidelines for reliable operation, which prescribe that the operation of electrical devices over such a very short time must still be ensured. With respect to aircraft, for example, "transparency time" is the state of the art term customary for the time after which the switchover or switching transient has taken place.

Within the framework of the method according to an aspect of the invention, briefly influencing the power supply, for example by interrupting the electrical connection or deactivating at least one electrical device, may thus only simulate this type of switchover for the respective device, which thereupon does not immediately cease its function. However, the respective electrical device may rather be prevented from coupling an unchanged electrical spurious signal into the electrical network during the short period of time. Influencing the power supply of an electrical device by separating the connection of the device from the electrical network may here include interrupting the link to the phases connected with the electrical device, while a return conductor, if present, does not necessarily have to be separated from the device.

Sequential influencing here includes influencing the power supply for a sequence of devices or device groups. The power supplies of the devices are here preferably run through in sequence, wherein the power supply of a device or device group is only influenced when the process of influencing another device or another device group has already ended, and a normal operating state has been established.

During each iterative analytical process, monitoring or checking the electrical network for electrical spurious signals thus makes it possible to determine whether a previously detected electrical spurious signal is still present or unchanged, or whether it changes or disappears entirely immediately after an electrical device is deactivated. Based on the correlation of sequential influencing processes and the disappearance or change of the electrical spurious signal, which device is causing the detected error may be determined.

The method according to an aspect of the invention makes error detection clearly more reliable and simpler, so that unequivocal diagnoses may be arrived at with respect to the correct function of the devices arranged in the electrical network. In addition, it is possible to reduce the weight and manufacturing costs of the electrical network or overall system comprised of the electrical network and electrical devices hooked up thereto, since it is no longer necessary to have each device incorporate corresponding sensors to monitor the respective device for electrical errors. An individual fault detection device in the network may preferably monitor several, many or all electrical devices, so that the majority of devices no longer have to perform any internal error monitoring. A fault detection device integrated into an electrical device may further be prevented from interpreting an electrical error released into the electrical network by another device as an intrinsic electrical error and issuing a false report. However, the fault detection device itself may also be situated in one of the devices connected with the network.

In an advantageous embodiment, influencing the power supply of a device includes its galvanic separation from the electrical network. To this end, interrupter units that are allocated to a respective device and establish the connection between the respective device and the electrical network may be sequentially activated so as to separate the respective devices from the electrical network completely, i.e., in particular with all phases, return conductors and grounding conductors. This may make it easier to preclude any error sources caused solely by the electrical wiring of a device, but not by its operation. An interrupter unit may also be configured to separate a device or even several devices from the network.

In an alternative embodiment, influencing the power supply of at least one of the devices involves reducing or eliminating the power consumption of a power electronics-based power supply of at least one of the devices. As a result, while the device still remains completely electrically connected with the network, it may briefly reduce or eliminate the circuit feedback containing the spurious signal via a reduced or absent consumption of electrical power.

Let it be noted at this juncture that the fault detection device may of course also be configured to reduce or eliminate the power supply from a power electronics-based power supply and also effect a shutdown by means of galvanically separating one or more devices. The complete galvanic separation may be suitable in special devices that also achieve circuit feedback when in the deactivated state owing to a larger inductance or capacitance. However, defects or other properties in power electronics that cause a spurious signal to be generated may also be detected given a remaining electrical connection by reducing or suspending the power supply.

In an advantageous embodiment, sequentially influencing at least one of the devices involves influencing the power supply of an entire group of devices, wherein, after a change in the respective spurious signal has been acquired, the power supply of at least one device in this group of devices is again sequentially influenced for a predetermined time, while respectively simultaneously checking the electrical network for a change in the respective electrical spurious signal, in order to iteratively determine which at least one device in this group of devices has experienced a change in the respective spurious signal. For example, the logical separation of various subnetworks or distribution lines that conduct electrical power to various groups of devices may markedly facilitate the search for errors, since not each electrical device has to be separated from the electrical network or influenced in some other way with regard to power supply, but rather only those belonging to a group of devices in which an error arises. After a subnetwork or distribution line incorporating the faulty device has been identified, the iterative search may there be performed by consecutively inspecting all devices located therein, or by continuously reducing the size of the group of devices to detect the device generating spurious signals.

In another advantageous embodiment, sequentially influencing the power supply of at least one of the devices for a predetermined time may include sequentially influencing the power supply of precisely one of the devices for a predetermined time. This makes sense in particular for electrical networks or subgroups of devices with a manageable number of devices.

In an advantageous embodiment, detecting an electrical spurious signal in the electrical network or checking the electrical network for any change in the respective electrical spurious signal includes recording the progression of an electrical variable at any point in the electrical network and filtering a known frequency pattern. Within the progression of the respective electrical variable that remains after the filtering process and is analyzed over time T, an electrical spurious signal should be visible only if present. Filtering may here include the use of at least one low-pass, high-pass or band-pass filter, wherein it is especially beneficial to use a high-pass filter, which should be adjusted to the frequency of the alternative voltage applied in the electrical network. This makes it possible to identify very slight harmonics. A chronological change in the spurious signal may be acquired even given a reduced power supply to a device responsible for the electrical spurious signal.

Let it be noted that the frequency, in particular in an electrical network on board an aircraft, does not necessarily have to comprise a constant frequency, but may also be variable, e.g., lie between 400 Hz and 800 Hz.

In this conjunction, let it further be noted that the recorded electrical variable may include both the voltage and the current. The undesired and unusual circuit feedback may markedly influence both electrical variables. In particular when using power electronics and/or larger inductances, e.g., those encountered for electric motors, pronounced interactions take place between the voltage and current. Depending on the type and number of electrical devices, either the voltage or current or both variables may generally be analyzed at the same time.

In an advantageous embodiment, a Fourier transformation is further performed, so that the recorded progression of electrical variables from which the known frequency patterns are filtered are checked for concise electrical spurious signals. This yields a signal progression in which potential electrical spurious signal portions comprise especially pronounced amplitudes, and may hence be detected especially well.

In another advantageous embodiment, a search for a faulty device ends as soon as a respective spurious signal disappears after influencing the power supply of at least one of the devices. As a consequence, the last device in the sequential progression of devices influenced in terms of their power supply may be identified as at least one possible error source. However, if the spurious signal is different than before while briefly influencing the power supply of a specific electrical device, or only less pronounced when deactivating a device, but still exists, it may be that the electrical network still comprises at least one other faulty electrical device. The type of spurious signals might differ in the at least two identified devices. The method according to the invention may then be continued.

In an advantageous embodiment, the time T is selected in such a way as not to limit the function of the respective at least one of the devices subjected to a sequential influencing of the power supply while its power supply is being influenced over that time. Time T must here measure below the "transparency time" cited above. When using the method in an aircraft, the latter may be design-specific, but also be subject to admission conditions that are not intended to limit the subject matter of the invention.

In another advantageous embodiment, time T is selected in such a way as to limitedly maintain the respective at least one of the devices subjected to a sequential influencing of the power supply while its power supply is being influenced over that time. However, the limitation should be imposed on a tolerable scale in order not to limit the overall function of the higher-level system, e.g., the aircraft. The respective tolerability here depends significantly on the main function of the respective device. For example, this may include slight losses in speed that arise over a few 100 ms with respect to fan motors.

The invention further relates to an electrical system that comprises at least one electrical network with several electrical devices hooked up thereto and at least one fault detection device hooked up thereto. The fault detection device is here configured to acquire electrical spurious signals in the electrical network, sequentially influence at least one of the devices for a predetermined time, and correspondingly check the electrical network for any change in the respective electrical spurious signal up until such time as the respective spurious signal changes, and to signal at which of at least one of the devices the respective spurious signal changed.

As a consequence, the electrical system per se is able to independently detect any potentially arising disturbances. It is not necessary for all devices to comprise a fault detection device for detecting potential electrical errors. Rather, it is sufficient to place a single fault detection device in the electrical network. It is further conceivable for this fault detection device to be situated in one of the devices hooked up to the electrical network itself or be designed as a separate unit.

The electrical system may comprise a corresponding interrupter unit for each of the devices, which is coupled with the at least one fault detection device. As a result, the individual electrical devices may be sequentially deactivated one after the other by means of the fault detection device, i.e., the devices may be sequentially deactivated from the electrical network, or the power consumption may be markedly or completely reduced by means of power electronics. Interrupter units able to separate several devices from the network are conceivable. The fault detection device may be configured to actuate power electronics in a respective device in such a way as to briefly markedly reduce or eliminate power consumption, and then raise it back to a normal level again.

In an advantageous embodiment, the at least one fault detection device comprises a recorder for recording the progression of an electrical variable, along with at least one electronic unit configured to filter known frequency patterns out of the recorded progression. As already described above, this makes it possible to analyze an electrical spurious signal distributed over the electrical network.

The invention further relates to an aircraft that integrates such an electrical system. As explained above, the devices installed therein are configured to bridge short-term interruptions in power supply, so as to implement the method according to the invention.

BRIEF DESCRIPTION OF THE DRAWINGS

Additional features, advantages and possible applications of the present invention may be gleaned from the following description of the exemplary embodiments and the figures. All described and/or graphically depicted features here comprise the subject matter of the invention, whether taken separately or in any combination, even independently of their composition in the individual claims or back references thereto. Furthermore, identical reference numbers on the figures stand for the same or similar objects.

DETAILED DESCRIPTION

Figure 1:
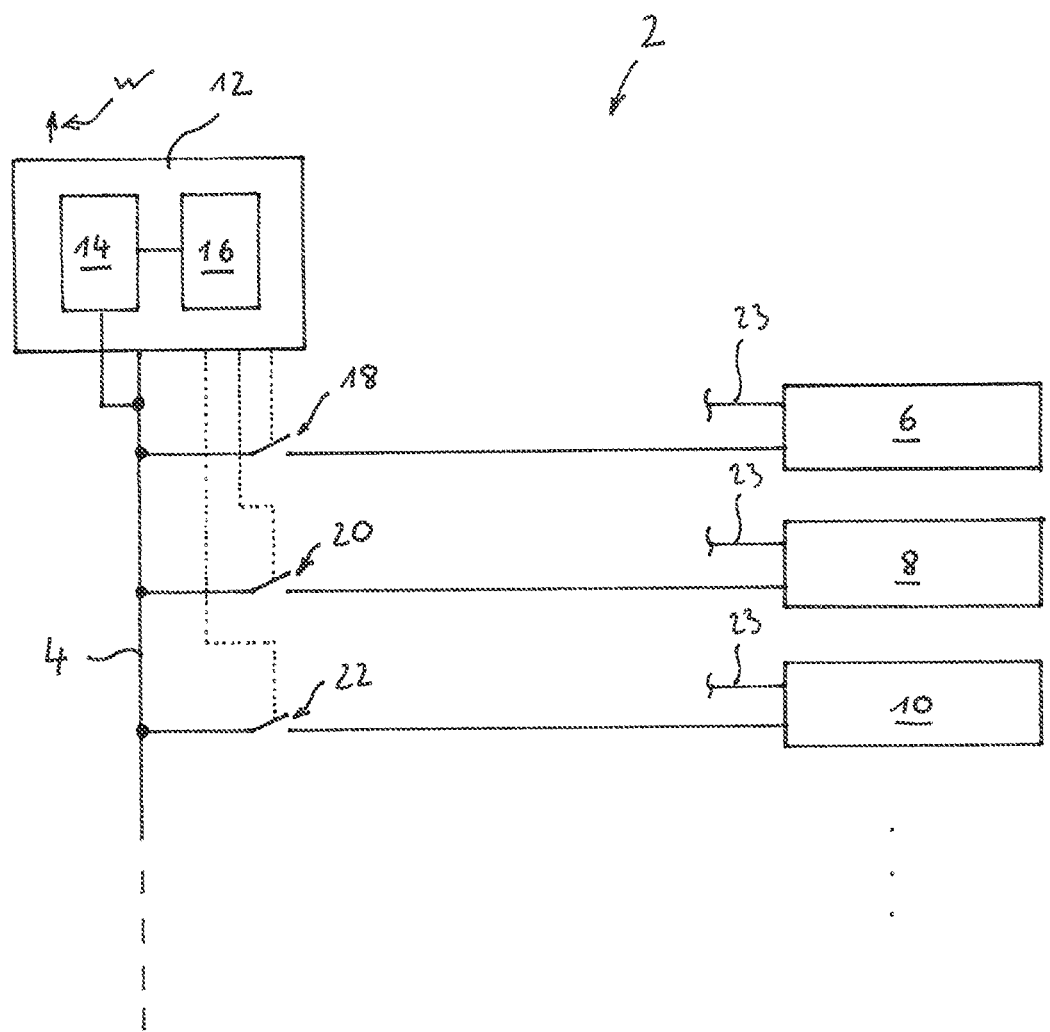
FIG. 1 presents a schematic view of an electrical system with an electrical network and several devices connected thereto.

FIG. 1 shows an electrical system 2 with an electrical network 4 to which several devices 6, 8 and 10 are connected. Also connected to the electrical network 4 is a fault detection device, which may comprise at least one recorder 14 and one electronic unit 16, which is hooked up with the recorder 14. The recorder 14 is able to record the progression of an electrical variable on the electrical network 4, and make it available internally as a signal that may be further processed. The electrical variable may here be a voltage or a current.

For example, the electronic unit 16 may be a calculator unit or consist of simpler digital and/or analog circuits. The electronic unit is primarily configured to filter known frequency patterns out of the recorded progression of the electrical variable, for example those belonging to the injected alternating voltage. If the electrical system 2 is located in an aircraft, for example, an alternating voltage with a frequency of 400 Hz and an exemplary voltage of 115 or 200 V may be transmitted via the electrical network 4. The presence of an electrical signal having a frequency clearly exceeding 400 Hz, whether it be an overtone or interharmonic, must thus be evaluated as an electrical spurious signal. As a result, the electronic unit 16 is preferably configured to filter oscillations with the network frequency (i.e., about 400 Hz) out of the recorded progression, so as to thereby identify alternating or constant electrical spurious signals.

For example, each of the devices 6, 8 and 10 is connected with a respective interrupter unit 18, 20 and 22, which are interconnected between the device 6, 8 and 10 and the electrical network 4. Each of these interrupter units 18, 20 and 22 is connected with the electronic unit 16, so that the latter may switch the respective interrupter unit 18, 20 and 22. Within the framework of checking the electrical network 4 for a device that generates an electrical spurious signal, the electronic unit 16 is configured to open the respective interrupter units 18, 20 and 22 in sequence, so as to verify, within a predetermined, very short time T, whether a detected electrical signal from the electrical network 4 changes as soon as the respective interrupter unit 18, 20 and 22 is open, thereby influencing the power supply of the respective device 6, 8 and 10.

In the case at hand, for example, this means that the interrupter units 18, 20 and 22 are initially closed, and the devices 6, 8 and 10 are supplied with an alternating voltage from the electrical network 4. If desired, the fault detection device may inspect the electrical network 4 permanently or as needed for the presence of any electrical spurious signals. If any are identified, the search for faulty devices may be initiated.

To this end, the electronic unit 16 may now first open the interrupter unit 18, so that the power supply of the device 6 is briefly influenced and in the present case completely interrupted, by separating the electrical connection to the electrical network 4. It may here be enough to separate one or more phases from the device 6 by means of the interrupter unit 18. If the device 6 is completely galvanically separated from the electrical network 4 by separating all lines of the electrical network 4 from the device 6, the circuit feedback of the device 6 may additionally be absolutely prevented from influencing the electrical network 4. In this example, if the fault detection device 12 determines that a formerly detected electrical spurious signal is still present unchanged and with the same strength during time T, the device 6 is not responsible for this spurious signal. After the connection between the device 6 and electrical network 4 has been reestablished, the next interrupter unit 20 may be opened, and the electrical network 4 may be checked for any change in the electrical spurious signal. This is continued in a finite series until such time as a change, for example the complete disappearance, of the spurious signal has been determined, or until each device 6, 8, 10 has been separated from the electrical network 4 at least partially once.

The devices 6, 8 and 10 may further be separated as a group of devices from the network, so that, if influencing the power supply of the entire group caused the disappearance of a spurious signal, an iterative search may subsequently be performed within this group to determine which at least one device of this group generated the spurious signal.

The respectively considered time T may here lie clearly under one second, for example within a range of a few 100 ms, and in the case of an electrical network 4 integrated into an aircraft, correspond to or exceed the interruption period when switching between various power supply sources between ground and flight operations.

The fault detection device 12 is preferably configured to indicate that a faulty device has been identified by means of an indicator signal w. When using an automated maintenance system or an electronic log, the corresponding indication may be recorded as a maintenance indication. The indicator signal w may further be output as an optical or acoustic signal, for example in a cockpit of an aircraft, if the electrical network 4 is an airborne power supply system.

Let it be mentioned by way of example that the individual devices 6, 8 and 10 may send out a configuration signal via communication lines 23, which confirms that partial or complete separation from the electrical network 4 has taken place. As a result, error search reliability may be increased, and erroneous time sequence allocations for activated interrupter units 18, 20 and 22 may be precluded.

In another variant, the fault detection device 12 may also be configured to actuate power electronics (not shown in detail) via the communication lines 23 in such a way as to briefly reduce the power supply or completely shut down a device 6, 8 or 10. Any changes that subsequently take place in an acquired electrical spurious signal may be interpreted by the fault detection device as having been caused by the respective device 6, 8 and 10 that was influenced in terms of power supply.

Figure 2:
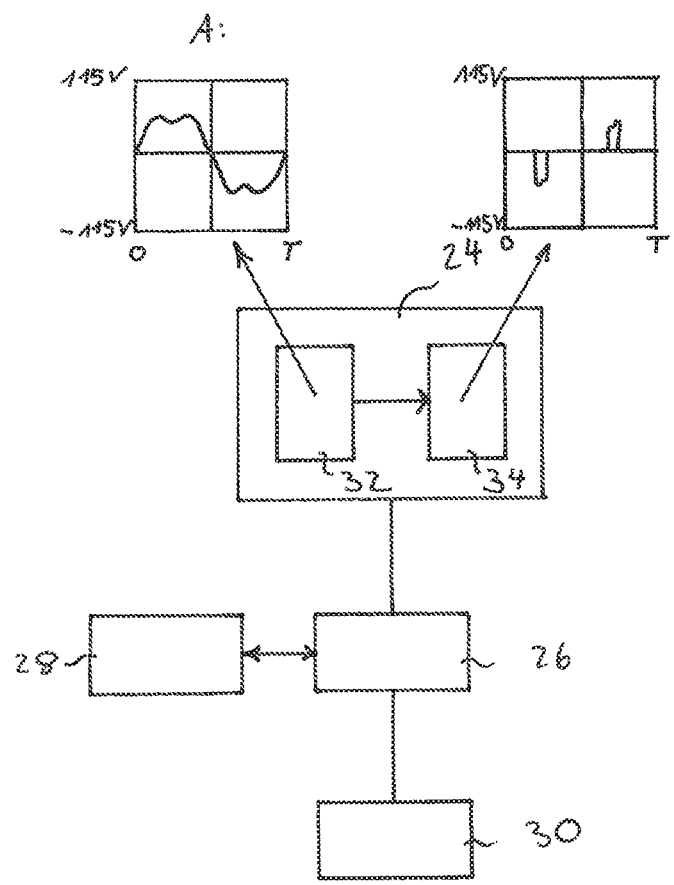
FIG. 2 presents a schematic, block-based depiction of the method according to the invention as a sequence of steps.

FIG. 2 presents a schematic, block-based depiction of an exemplary embodiment for the method according to the invention for detecting a device that generates spurious signals in an electrical network 4. During the conventional operation of the electrical system 2, the electrical network 4 may first be checked for electrical spurious signals 24. If such a spurious signal is present, the power supply of at least one of the devices 6, 8 and 10 may be sequentially influenced 26 for a specific time T, and the electrical network 4 may be correspondingly checked 28 for any change in the respective spurious signal. As soon as the spurious signal changes, e.g., disappears, a signal 30 is output to indicate which at least one device 6, 8 and 10 is generating a spurious signal or responsible for the spurious signal.

Monitoring the electrical network 4 for spurious signals may include recording 32 a progression for an electrical variable, i.e., voltage and/or current, and filtering out 34 know frequency patterns. This is illustrated by example in a recorded voltage progression A, which comprises recesses and hence no ideal sinusoidal shape. After the actual alternating voltage transmitted by the electrical network 4 has been filtered out, a filtered signal progression F is provided. In the exemplary depiction, the latter comprises two progression peaks, which may be compared with a tolerance value. After a comparison with tolerable and unavoidable circuit feedback with the devices 6, 8, 10 in operation, if it turns out that these progression peaks clearly deviate from the circuit feedback during normal operation, for example in terms of their amplitude or some other electrical characteristic, an indicator signal must be generated 30. The tolerance limits must here be individually adjusted to the electrical system 2, and may include specific frequency ranges, root-mean-square values, amplitudes or other electrical characteristics, which are included by the normal circuit feedback for all devices.

In addition, let it be noted that "comprising" does not preclude any other elements or steps, and that "a" or "an" do not rule out a plurality. Let it further be noted that features described with reference to one of the above exemplary embodiments may also be used in combination with other features of other exemplary embodiments described above. References in the claims are not to be construed as limitations.

The invention claimed is:

1. A method for detecting a device that generates spurious signals in an electrical network, to which several devices and at least one fault detection device are connected, comprising the following steps:
    acquiring an electrical spurious signal in the electrical network;
    sequentially influencing the power supply of the devices one after another, each for a predetermined time, via the electrical network, and correspondingly checking the electrical network for any change in the respective electrical spurious signal resulting from this influencing until such time as the respective spurious signal changes; and
    signaling at which one of the devices the respective spurious signal changed,
    wherein the predetermined time is selected in such a way as not to limit the function of the respective at least one of the devices subjected to a sequential influencing of the power supply while its power supply is being influenced over the predetermined time, or
    wherein the predetermined time is selected in such a way as to limitedly maintain the respective at least one of the devices subjected to a sequential influencing of the power supply while its power supply is being influenced over the predetermined time.

2. The method of claim 1, wherein influencing the power supply of the devices includes its galvanic separation from the electrical network.

3. The method of claim 1, wherein influencing the power supply of the devices includes reducing or eliminating the power consumption of a power electronics-based power supply of the devices.

4. The method of claim 1, wherein detecting electrical spurious signals in the electrical network or checking the electrical network for any change in the respective electrical spurious signal includes recording the progression of an electrical variable in the electrical network and filtering at least one known frequency pattern.

5. The method of claim 4, wherein filtering includes the use of at least one low-pass, high-pass or band-pass filter.

6. The method of claim 4, further comprising the performance of a Fourier transformation.

7. An electrical system comprising at least one electrical network with several devices hooked up thereto and at least one fault detection device hooked up thereto,
    wherein the fault detection device is configured to acquire electrical spurious signals in the electrical network, sequentially influence the devices one after another, each for a predetermined time, and correspondingly check the electrical network for any change in the respective electrical spurious signal up until such time as the respective spurious signal changes, and to signal at which one of the devices the respective spurious signal changed,
    wherein the predetermined time is selected in such a way as not to limit the function of the respective at least one of the devices subjected to a sequential influencing of the power supply while its power supply is being influenced over the predetermined time, or
    wherein the predetermined time is selected in such a way as to limitedly maintain the respective at least one of the devices subjected to a sequential influencing of the power supply while its power supply is being influenced over the predetermined time.

8. The electrical system of claim 7, further comprising an interrupter unit for each one of the devices, wherein the interrupter units are coupled with the at least one fault detection device in such a way that the fault detection device can interrupt the connection between the devices and the electrical network by actuating the interrupter units.

9. The electrical system of claim 7, wherein the at least one fault detection device comprises a recorder for recording the progression of an electrical variable.

10. The electrical system of claim 9, wherein the at least one fault detection device comprises an electronic unit configured to filter known frequency patterns out of the recorded progression.

11. An aircraft with an electrical system, the electrical system comprising:
    at least one electrical network with several devices hooked up thereto and at least one fault detection device hooked up thereto,
    wherein the fault detection device is configured to acquire electrical spurious signals in the electrical network, sequentially influence the power supply of the devices one after another, each for a predetermined time, and correspondingly check the electrical network for any change in the respective electrical spurious signal up until such time as the respective spurious signal changes, and to signal at which one of the devices the respective spurious signal changed,
    wherein the predetermined time is selected in such a way as not to limit the function of the respective at least one of the devices subjected to a sequential influencing of the power supply while its power supply is being influenced over the predetermined time, or
    wherein the predetermined time is selected in such a way as to limitedly maintain the respective at least one of the devices subjected to a sequential influencing of the power supply while its power supply is being influenced over the predetermined time.

* * * * *